United States Patent [19]
Yin et al.

[11] Patent Number: 5,103,268
[45] Date of Patent: Apr. 7, 1992

[54] SEMICONDUCTOR DEVICE WITH INTERFACIAL ELECTRODE LAYER

[75] Inventors: Ming-Jau Yin; David P. Tanner, both of Thousand Oaks, Calif.

[73] Assignee: Siemens Solar Industries, L.P., Camarillo, Calif.

[21] Appl. No.: 728,753

[22] Filed: Jul. 8, 1991

Related U.S. Application Data

[63] Continuation of Ser. No. 331,314, Mar. 30, 1989, abandoned.

[51] Int. Cl.⁵ ............................................. H01L 27/12
[52] U.S. Cl. ......................................... 357/4; 357/67; 357/71; 357/68
[58] Field of Search ................. 357/4, 67, 68, 65, 71

[56] References Cited
U.S. PATENT DOCUMENTS 4,517,403 5/1985 Morel et al. .................... 136/249
4,542,578 9/1985 Yamano et al. ................... 437/2

Primary Examiner—Eugene R. LaRoche
Assistant Examiner—R Ratliff
Attorney, Agent, or Firm—Nilsson, Robbins, Dalgarn, Berliner, Carson & Wurst

[57] ABSTRACT

A semiconductor device having a thin film silicon-containing active layer and a metallic first electrode is provided with an interfacial metallic layer at an inner surface of a second electrode to increase electrical resistance and thereby reduce shunts adjacent pinhole-type defects of the active layer. The interfacial layer is preferably made of a metal selected from the group consisting of tin, gold, titanium, palladium and tantalum.

12 Claims, 4 Drawing Sheets

SEMICONDUCTOR DEVICE WITH INTERFACIAL ELECTRODE LAYER

This application is a continuation of Ser. No. 331,314, filed Mar. 30, 1989, abandoned.

BACKGROUND OF THE INVENTION

This invention relates to thin film semiconductor devices and, more particularly, to thin film devices having an interfacial metallic layer associated with one electrode to minimize shunting at pinhole-type defects of an active layer.

Thin film devices, and specifically photovoltaic devices, are often deposited on glass substrates having metal oxide coatings which serve as transparent "window" electrodes. A semiconductor layer containing a rectifying junction is deposited onto the window layer, followed by a back electrode to complete the device. Unfortunately, many thin film semiconductors tend to be deposited nonuniformly, causing pinholes, voids, thin spots or other structural defects (hereinafter collectively referred to as "pinhole-type defects") which join the two electrodes. Such defects form electrically conductive paths which can shunt the device and render it useless.

Various methods have been tried to reduce pinhole-type defects, or to fix the resulting shunts once they have been formed, but such methods have met with only limited success. In the case of thin film silicon photovoltaic cells having a window electrode of tin oxide and a back contact electrode of aluminum, applying a potential opposite to the usual polarity of the device has been observed to produce flashes of light visible through the window electrodes. Tests have shown that photovoltaic devices processed in this manner have improved operating efficiency. This indicates that at least some of the pinhole-type defects have been eliminated.

Unfortunately, not all thin film device structures can be "fixed" by applying a reverse bias potential. When known electrode materials other than tin oxide and aluminum are used, a reverse bias voltage often has little or no effect on the existence of shunts. This is the case when zinc oxide is used as a window electrode in a device having a thin film silicon-containing layer. Such devices exhibit significant shunting and no fixing effect when the second electrode is selected from metals heretofore proposed.

Therefore, it is desirable in many applications to provide a device and a method of manufacturing the device which minimize shunts at pinhole-type defects of a silicon-containing semiconductor layer and facilitate fixing of such shunts.

SUMMARY OF THE INVENTION

The present invention provides a structure and method wherein a thin film semiconductor device having a metal oxide window layer is provided with a back electrode layer having an interfacial metal portion selected to be compatible with the active layer and to minimize shunting at pinhole-type defects of the active layer. The interfacial portion minimizes shunting by increasing electrical resistance between the first and second electrodes at the location of any such defects.

The materials used in the interfacial portion are tin, gold, titanium, palladium and tantalum. The interfacial portion may contain layers of one or more of these materials and should be at least 50 angstroms in overall thickness. If necessary, it may be backed by layers of other, more conventional electrode materials selected on the basis of conductivity and environmental stability.

Accordingly, the present invention comprises a semiconductor device and method which involve: a thin film active layer containing silicon and having front and back surfaces; a first electrode having a layer of light transmissive metal oxide at the front surface of the active layer; and, a second electrode having an interfacial layer at the back surface of the active layer, the interfacial layer containing a metal which increases electrical resistance between the first and second electrodes adjacent to pinhole-type defects of the active layer. The interfacial layer preferably comprises one or more metals selected from the group consisting of tin, gold, titanium, palladium and tantalum.

BRIEF DESCRIPTION OF THE DRAWINGS

The above and other features of the present invention may be more fully understood from the following detailed description, together with the accompanying drawings, wherein similar reference characters refer to similar elements throughout and in which.

DESCRIPTION OF THE PREFERRED EMBODIMENT

Figure 1:
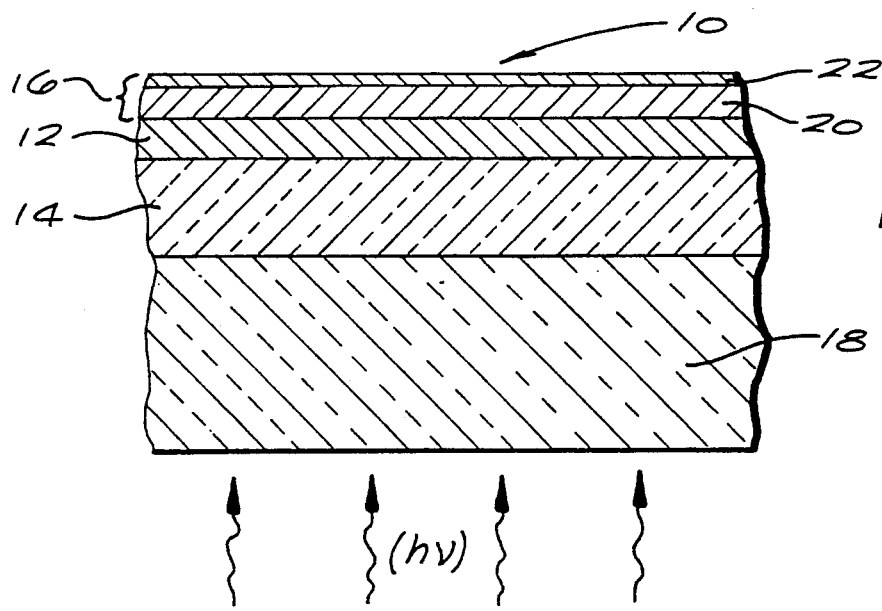
FIG. 1 is a fragmentary sectional view showing an exemplary embodiment of a semiconductor device deposited according to a preferred embodiment of the present invention on a transparent substrate.

Referring to FIG. 1, a photovoltaic or other semiconductor device 10 constructed according to a preferred embodiment of the present invention has a thin film active layer 12 disposed between a transparent first electrode 14 and an opaque second electrode 16. The first electrode 14 is formed of a transparent conductive metal oxide and is deposited on a glass substrate 18 to function as a "window" layer for admission of light (h) onto the active layer 12. The metal oxide of the window layer may be tin oxide, indium tin oxide, zinc oxide or any other material of high conductivity and optical transmittance. However, the following description will focus on the use of zinc oxide as a window layer in that the problem of shunting is especially acute when zinc oxide is used. The active layer 12 is a thin film silicon-containing layer made up of a plurality of sub-layers of differing conductivity type which define a semiconductor junction. The second electrode 16 is deposited over the active layer 12 in order to complete the connection to the active layer.

The second electrode 16 is made up of a plurality of layers superimposed on one another to perform the usual functions of a back contact electrode and reduce the shunting which might otherwise occur at "pinhole-type" defects of the active layer 12. In its simplest form, the second electrode 16 consists of an interfacial layer 20 and an outer layer 22. The interfacial layer 20 is made of a metal which tends to form high resistance regions adjacent any pinhole-type defects of the silicon-containing active layer 12, even when the window layer is made of zinc oxide, and which exhibits an ability to reduce shunts through the active layer even further by applying a reverse bias voltage to the device. Metals having these properties are referred to herein as "fixable". They include tin, gold, titanium, palladium and tantalum. The outer layer 22 may be a predominantly nickel layer of the type described in U.S. Pat. No. 4,769,086, which provides good environmental protection for the device 10.

Figure 2A:
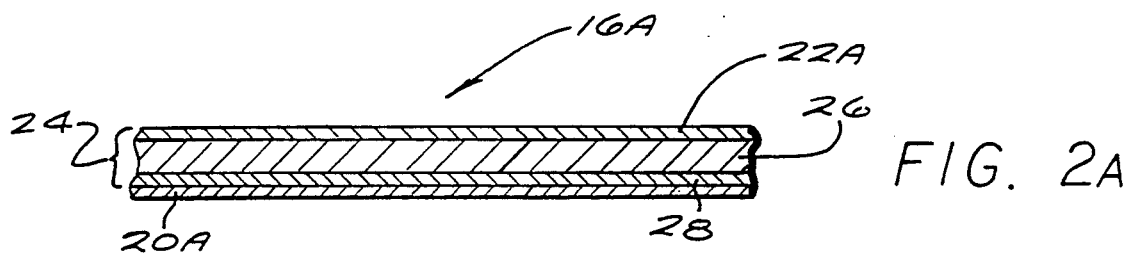
FIG. 2A is a fragmentary sectional view of an alternate embodiment of the back contact portion of the device of FIG. 1.
Figure 2B:
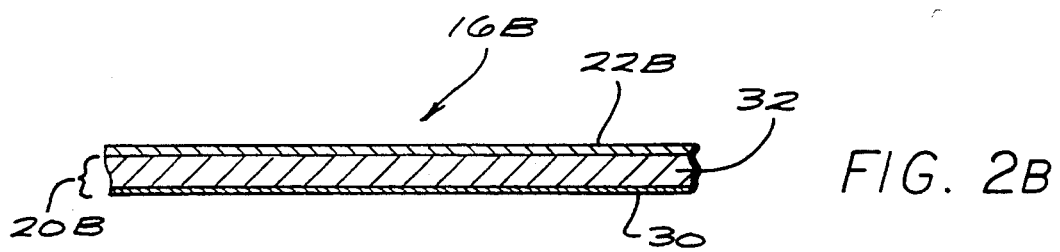
FIG. 2B is a fragmentary sectional view of another alternate embodiment of the back contact portion of the device of FIG. 1.
Figure 2C:
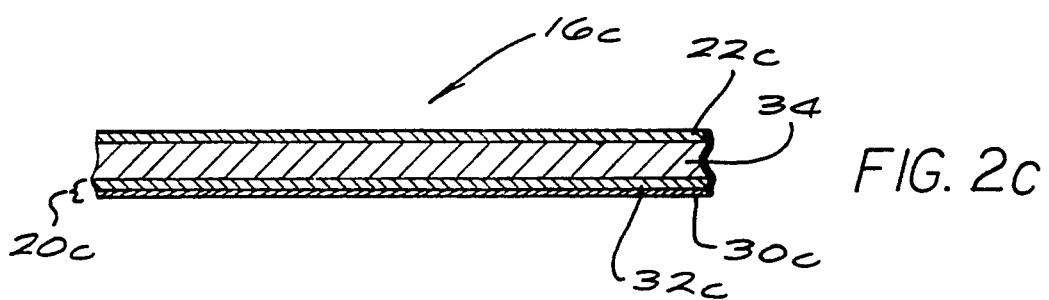
FIG. 2C is a fragmentary sectional view of yet another embodiment of the back contact portion of the device of FIG. 1.

Alternate forms of the second electrode of the device 10 are illustrated in FIGS. 2A, 2B and 2C, wherein other portions of the device are omitted for clarity. Each electrode structure has an interfacial layer made up of one or more discrete layers of metals chosen from the group of "fixable" metals described above, i.e., tin, gold, titanium, palladium and tantalum. Referring specifically to FIG. 2A, a second electrode 16A has a homogeneous interfacial layer 20A which is similar to the interfacial layer 20 of FIG. 1 but substantially thinner. It is backed by a multilayer portion 24 having individual layers of metals selected to reduce the overall sheet resistance of the electrode 16A and protect the interfacial layer 20A from the environment. In a preferred form of the invention, the multilayer portion 24 has a central layer 26 formed of aluminum or similar conductive material between a pair of thinner layers 22A and 28. The layer 22A preferably contains nickel for protection from the environment while the layer 28 may be nickel or any other metal compatible with the "fixable" metal of the interfacial layer 20A.

In the embodiments of FIGS. 1 and 2A, the interfacial layer is preferably a homogeneous layer of "fixable" metal thick enough to produce high resistance regions adjacent any pinhole-type defects of the active layer 12 and form reliable contacts with the front window electrode at preselected regions of interconnection. Thus, the interfacial layers 20 and 20A are each at least 50 angstroms, preferably between 300 and 2000 angstroms, and more preferably between 500 and 1500 angstroms, thick. Where the interfacial layer is intended to make a significant contribution to conductivity, as in the embodiment of FIG. 1, it should be at least 1000 angstroms and preferably at least 1500 angstroms in thickness. When an auxiliary layer such as the central layer 26 is used to enhance conductivity, the interfacial layer is at least 50 angstroms, preferably at least 300 angstroms, and more preferably approximately 500 angstroms, thick.

As mentioned above, the interfacial layers 20 and 20A are made of one or more of the metals disclosed herein to be fixable in the context of thin film silicon-containing devices having zinc oxide front electrodes. The metal which exhibits the most dramatic reduction in shunting is tin, which is so effective at providing high resistance regions near pinhole-type defects that the reverse bias method is often not necessary. Tin automatically "fixes" a large proportion of the defects which would otherwise produce shunting through the semiconductor layer and is ideal for this purpose. Its only drawback is its poor reflective properties which reduce the amount of light directed back into the semiconductor layer and therefore reduce the output current of the device when used as a photovoltaic cell. Gold, on the other hand, is highly reflective but usually requires a reverse bias potential in order to reduce shunting significantly. Gold is also very expensive and does not adhere well to silicon-based semiconductors in many circumstances. Titanium, palladium and tantalum all adhere well to silicon-based semiconductors but are not good reflectors.

In order to take advantage of the fact that each fixable metal has different reflection, adhesion and cost factors, it is often desirable to form the interfacial layer as a composite of several sub-layers selected to give improved overall properties. Two such embodiments are shown by way of example in FIGS. 2B and 2C. Each embodiment has an ultrathin layer of a first fixable metal, such as tin or titanium, which fixes well and adheres to thin film amorphous silicon but has poorer electrical conductivity and reflectivity than some of the other listed metals. It is then supplemented by a thicker second layer of a fixable metal, such as gold, which is more reflective. The combination of the ultrathin layer and the thicker second layer, both of which are fixable, acts to minimize shunting while it reflects transmitted light back into the semiconductor layer.

Referring specifically to FIG. 2B, a layer 20B which serves the same function as the interfacial layer 20 of FIG. 1 consists of: an ultrathin layer 30 of a first fixable metal which exhibits good adhesion to silicon-based alloys; and, a thicker layer 32 of a second, more highly reflective "fixable" metal. In a preferred embodiment, the ultrathin layer 30 is tin or titanium and the thicker layer 32 is gold. An outer layer 22B of nickel or other suitable material is then provided over the thicker layer 32 to protect the device from the environment. The ultrathin layer 30 is preferably between 30 and 100 angstroms thick, and is more preferably 50 angstroms thick. The second layer 32 is in the range of thicknesses discussed above in connection with the interfacial layer 20 of FIG. 1. Thus, the second layer is at least 50 angstroms, preferably between 300 and 2000 angstroms, and more preferably between 500 and 1500 angstroms, thick.

FIG. 2C depicts a second electrode 16C having an interfacial layer 20C selected from the same group of materials with the same basic considerations as the materials of the layer 20B of FIG. 2B. Thus, the interfacial layer 20C consists of an ultrathin layer 30C and a thicker second layer 32C. The only difference is that the second layer 32C is thinner than the second layer 32 of FIG. 2B in order to reduce the cost of manufacturing the device. As long as the second layer 32C and the ultrathin layer 30C have a combined thickness of at least 50 angstroms, and preferably between approximately 300 and 500 angstroms, they will provide the desired fixing and reflection properties. Electrical conductivity is then enhanced by depositing an auxiliary conducting layer 34 of copper or other suitable conductor more than 500 angstroms thick directly over the second layer 32C. Again, an outer, nickel-containing layer 22 is provided to seal the device from the environment.

The embodiments of FIGS. 1, 2A, 2B and 2C exemplify the large number of options available in utilizing the fixable materials of the present invention in an electrode structure which does not suffer from the adverse effects of shunting at pinhole-type defects in a thin film silicon-containing active layer. This is done by providing an interfacial layer, either as a homogeneous layer or a plurality of layers superimposed on one another, which exhibits the characteristic property of fixability, adheres well to the silicon-based semiconductor, and reflects most of the light reaching it back into the semiconductor.

Figure 5:
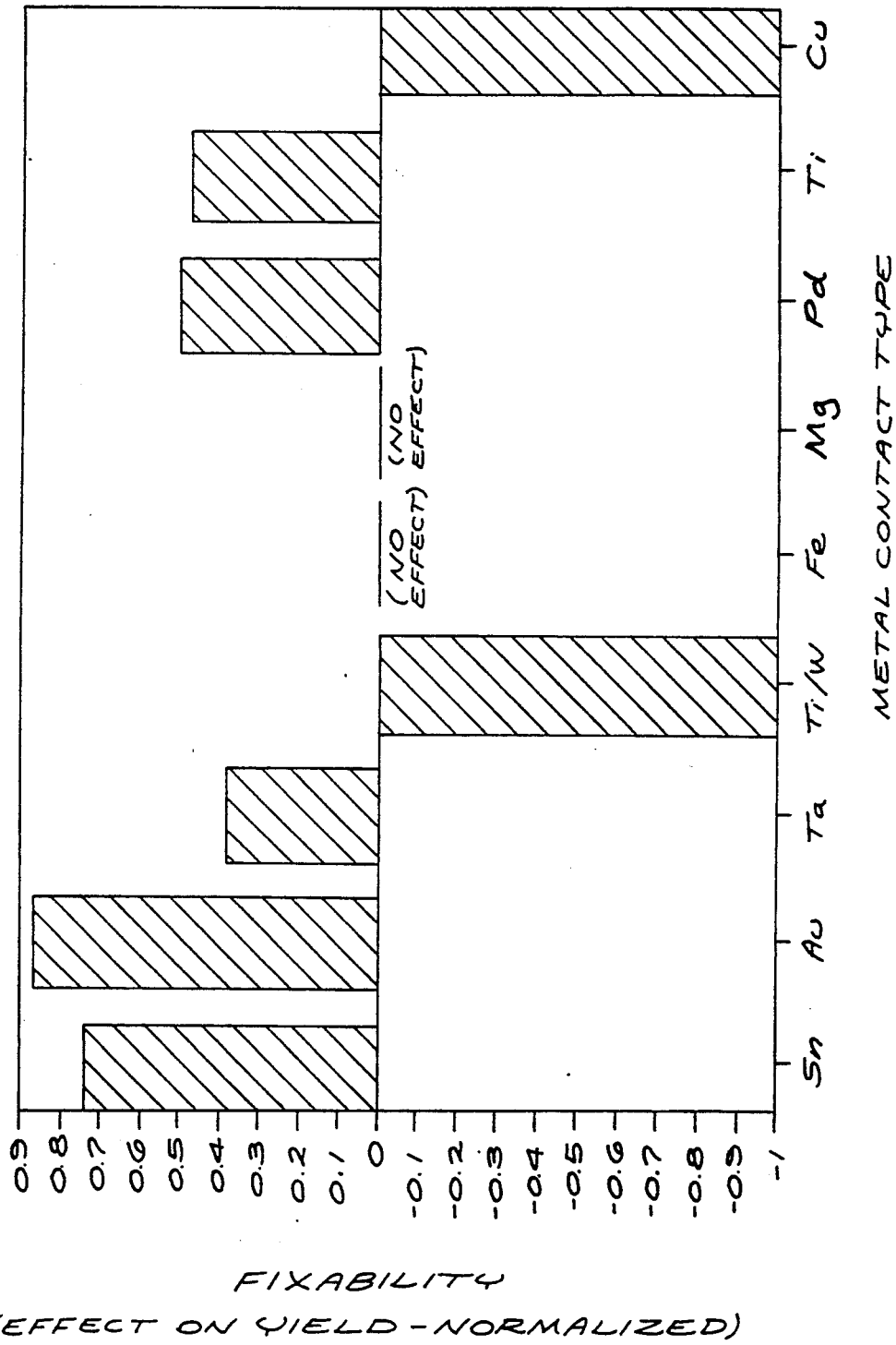
FIG. 5 is a graph showing the effect of applying a reverse bias voltage to solar cell structures constructed according to FIG. 1 using a variety of different interface metals.

FIG. 5 illustrates the effect of applying a reverse bias voltage to solar cell structures constructed according to the embodiment of FIG. 1 using a variety of different metals as the interfacial layer 20. In each case, the metal oxide window electrode 14 is made of zinc oxide. The ordinate of FIG. 5 represents "fixability" of the structures tested, i.e., the normalized effect on manufacturing yield when a reverse bias voltage of approximately five volts is applied.

Interfacial layers of tin (Sn) and gold (Au) give rise to high positive effects on yield, while titanium (Ti), palladium (Pd) and tantalum (Ta) also produce marked positive effects. Iron (Fe) and Magnesium (Mg) show no significant difference and titanium/tungsten alloy (Ti/W) and copper (Cu) are adversely affected by reverse bias treatment.

Several of the metals listed herein tend to minimize shunts in thin film silicon-containing cells having zinc oxide front contacts even without reverse bias treatment. A good example of this is tin. For any of the listed metals, however, manufacturing yield will usually be better with the reverse bias step.

Unfortunately, the phenomenon by which shunting is reduced using the interfacial layer disclosed herein, either before or after reverse bias treatment, is not fully understood.

While not bound by any theory, applicants believe that the fixable nature of tin, gold and palladium is related to their vapor deposition and film condensation characteristics. For example, they may deposit as very small droplets having small contact area into pinhole-type defects of the semiconductor and form only minor shunts to the opposite electrode layer. In the case of titanium and tantalum, the explanation probably lies at least partially in the fact that these materials form a nonconductive oxide which tends to isolate the electrodes from each other at the location of pinhole-type defects.

Figure 3:
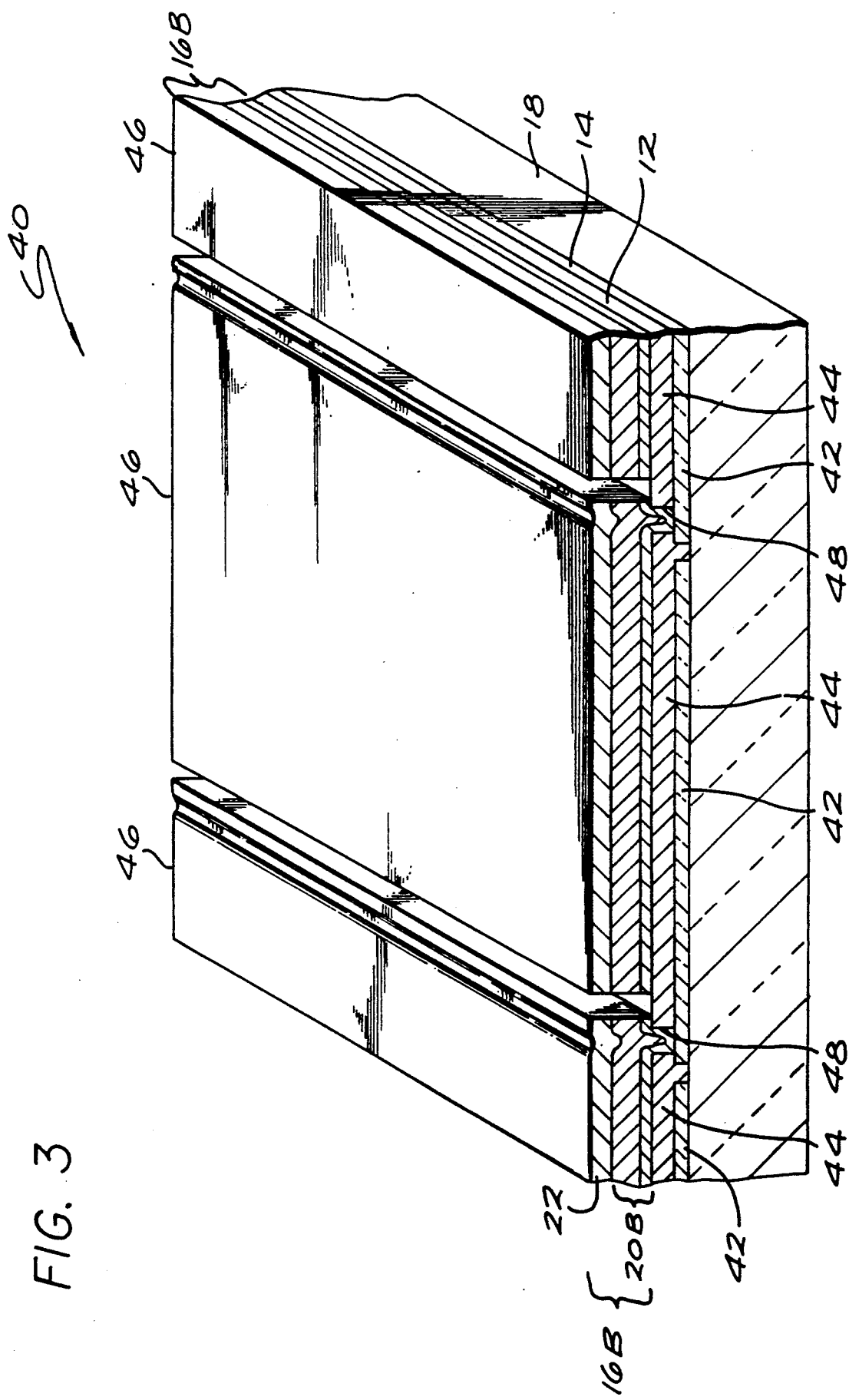
FIG. 3 is a fragmentary isometric view of a photovoltaic module containing a plurality of cells similar to the device of FIG. 1, with the front surface of the module shown in vertical section.
Figure 4:
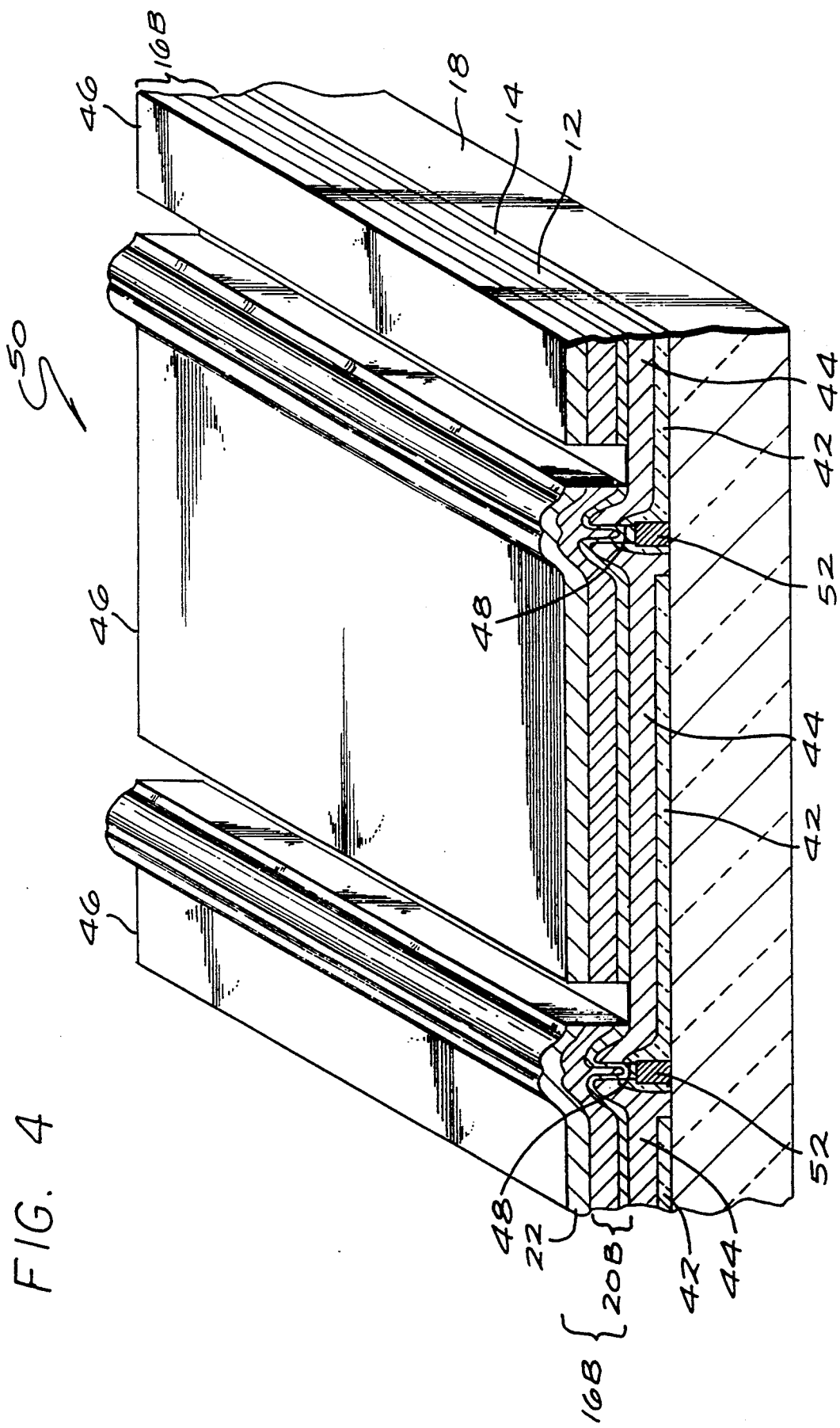
FIG. 4 is an isometric view of an alternate embodiment of the module of FIG. 3, with the front surface of the module shown in vertical section.

In addition to minimizing shunts, the interfacial layer of the present invention is able to make good electrical contact to the metal oxide layer at the front surface of the structure in order to connect two or more devices in series. Photovoltaic modules embodying this concept are illustrated in FIGS. 3 and 4, which embody the device structure of FIG. 1 and the second electrode structure of FIG. 2B. Thus, a module 40 of FIG. 3 has a glass substrate 18, a transparent first electrode 14 separated into a plurality of first electrode pads 42, a thin film active layer 12 forming an active region 44 over each of the first electrode pads, and a second electrode 16B divided into second electrode pads 46. The patterning of the first and second electrodes into separate pads may be done by laser scribing or other suitable means. A groove 48 in the active layer is formed by a separate scribing or other patterning step before the second electrode is deposited so that material of each second electrode pad is deposited over and in contact with an edge of a first electrode pad 42 of an adjoining active region. Due to the unique characteristics of the interfacial layer 20B, the second electrode pads 46 make good electrical contact to the first electrode pads 42 to connect the active regions 44 in series. It is not necessary to fuse the interconnects with a laser or other source of localized energy after deposition. In fact, the application of high levels of localized energy along the interconnect can actually hurt its electrical properties.

FIG. 4 depicts a photovoltaic module 50 which is the same as the module 40 of FIG. 3 except that a plurality of conductive stripes or "stitch bars" 52 are deposited on the glass substrate prior to the metal oxide electrode 14 to aid in interconnection. Because the conductive stripes 52 are located beneath the metal oxide layer, however, a groove must be patterned through both the semiconductor layer 12 and the metal oxide layer 14 to expose the conductive stripes before the second electrode 16B is deposited. This allows the components of the interfacial layer 20B to extend into the patterned groove 48 and contact the conductive stripes 52. The resulting connection is extremely reliable.

In fabricating the device of the present invention, the transparent metal oxide and the thin film active layer may be deposited by any suitable method known in the semiconductor field. Specifically, the active layer may have a PIN structure such as that described in U.S. Pat. No. 4,517,403 for "Series Connected Solar Cells and Method of Formation", and the steps of patterning the semiconductor layers can be performed in the same way. A major difference, however, is that the interconnects of the present invention are not locally heated or otherwise "fused" as described in the patent.

The second electrode layers of the present invention, including the interfacial layers which contact the semiconductor itself, may be deposited by any conventional method which yields a relatively uniform deposition. Suitable methods include evaporation, sputtering, and ion milling, all of which may be carried out at room temperature.

From the above, it can be seen that the structure and method of the present invention provide an improved semiconductor device which exhibits little or no shunting at pinhole-type defects of its active layer, even when used with transparent metal oxides such as zinc oxide.

The appended claims are not limited to the embodiments described herein but rather are intended to cover all variations and adaptations falling within the true scope and spirit of the present invention. For example, the invention applies to a wide range of semiconductor devices in addition to the photovoltaic devices discussed in detail herein.

What is claimed is:

1. A semiconductor device comprising:
   a thin film active layer containing silicon and having front and back surfaces;
   a first electrode having a layer of light transmissive zinc oxide at the front surface of the active layer; and
   a second electrode having at least one conductive layer and an interfacial layer intermediate the conduction layer and the back surface of the active layer, the interfacial layer comprising a metal which increases electrical resistance between the first and second electrodes adjacent pinhole-type defects of the active layer.

2. The thin film semiconductor device of claim 1 wherein:

the interfacial layer comprises a metal selected from the group consisting of tin, gold titanium, palladium and tantalum.

3. The thin film semiconductor device of claim 1 wherein:

the interfacial layer comprises a metal selected from the group consisting of tin and gold.

4. The thin film semiconductor device of claim 1 wherein:

the interfacial layer comprises tin.

5. The thin film semiconductor device of claim 1 wherein:

the interfacial layer comprises a first layer between 30 and 100 angstroms thick and comprising a metal selected from the group consisting of tin, titanium, palladium and tantalum; and a back-up layer of gold on a surface of the first layer opposite to the active layer.

6. The thin film semiconductor device of claim 5 wherein:

the second electrode has the at least one conductive layer on a surface of the back-up layer opposite to the active layer.

7. The thin film semiconductor device of claim 6 wherein:

the back-up layer is up to 500 angstroms thick; and, said at least one conductive layer comprises a metallic conduction layer more than 500 angstroms thick.

8. The thin film semiconductor device of claim 7 wherein:

said metallic conduction layer contains a metal selected from the group of copper and aluminum.

9. The thin film semiconductor device of claim 8 wherein:

said at least one conductive layer further comprises a metallic encapsulation layer.

10. The thin film semiconductor device of claim 1 wherein:

the semiconductor device is a photovoltaic module.

11. The thin film semiconductor device of claim 1 wherein:

the first electrode is separated into a plurality of discrete first electrode pads;

the thin film active layer is deposited over the first electrode to form an active region over each of said first electrode pads;

the second electrode is separated into a plurality of discrete second electrode pads, each second electrode pad substantially overlying one of said active regions and overlapping an edge of one of said first electrode pads at a preselected interconnect portion of the active layer;

the active layer having a series of grooves therein at said interconnect portions so that the second electrode pad of each active region electrically contacts the first electrode paid of an adjoining active region to place the active regions in series.

12. A semiconductor device comprising:

a thin film active layer containing silicon and having front and back surfaces;

a first electrode having a layer of light transmissive zinc oxide at the front surface of the active layer; and a second electrode having at least one conduction layer and an interfacial layer intermediate the conduction layer and the back surface of the active layer, the interfacial layer comprising a metal selected from the group consisting of tin, gold, titanium, palladium and tantalum, said interfacial layer serving to increase electrical resistance between the first and second electrodes adjacent pinhole-type defects of the active layer.

* * * * *